United States Patent [19]

Umehara

[11] Patent Number: 5,016,006

[45] Date of Patent: May 14, 1991

[54] AUDIO ALARM OUTPUTTING DEVICE FOR OUTBOARD ENGINE

[75] Inventor: Kazuhiro Umehara, Hamamatsu, Japan

[73] Assignee: Suzuki Jidosha Kogyo Kabushiki Kaisha, Shizuoka, Japan

[21] Appl. No.: 222,182

[22] Filed: Jul. 21, 1988

[30] Foreign Application Priority Data

Jul. 31, 1987 [JP] Japan .................. 62-193235

[51] Int. Cl.$^5$ ............................................. G08B 23/00
[52] U.S. Cl. .................................. 340/984; 340/460; 440/2
[58] Field of Search ............... 340/984, 52 D, 52 F, 340/62, 384 R, 384 E, 521, 692, 425.5, 438, 439, 441, 460; 440/2

[56] References Cited

U.S. PATENT DOCUMENTS

| | | | |
|---|---|---|---|
| 3,546,668 | 12/1970 | Legler et al. | 340/62 |
| 4,019,489 | 4/1977 | Cartmill | 340/611 |
| 4,143,352 | 3/1979 | Jarmotz | 340/62 |
| 4,342,023 | 7/1982 | Tsunoda et al. | 340/692 |
| 4,346,364 | 8/1982 | Takagi et al. | 340/460 |
| 4,401,971 | 8/1983 | Saito et al. | 340/692 |
| 4,438,422 | 3/1984 | Nojiri et al. | 340/692 |
| 4,631,515 | 12/1986 | Blee et al. | 340/439 |
| 4,785,280 | 11/1988 | Fubini et al. | 340/384 E |
| 4,940,965 | 7/1990 | Umehara | 340/460 |
| 4,971,583 | 11/1990 | Umehara | 340/460 |

Primary Examiner—Joseph A. Orsino
Assistant Examiner—Brent A. Swarthout
Attorney, Agent, or Firm—Flynn, Thiel, Boutell & Tanis

[57] ABSTRACT

An audio alarm outputting device for an outboard engine includes a plurality of sensors for detecting abnormalities, such as in the cooling water flow, and a speech outputting circuit for receiving output signals from the plurality of sensors and outputting abnormal conditions of the signals in a vocalized form. A variable voice level setting circuit cooperable with the speech outputting circuit automatically increases in steps the output level of the speech outputting circuit as the engine speed increases.

9 Claims, 3 Drawing Sheets

AUDIO ALARM OUTPUTTING DEVICE FOR OUTBOARD ENGINE

FIELD OF THE INVENTION

The present invention relates to an audio alarm device for an outboard engine and, more particularly, to such an audio alarm device which detects overheating of the engine and other abnormalities, and signals each detected abnormality by a voice.

BACKGROUND OF THE INVENTION

In a water-cooled outboard engine, it is known to have cooling water sucked by means of a water pump provided within a gear case, to circulate it through a cylinder jacket, and to then discharge it from the system. The circulation of the cooling water stops if the suction inlet therefor becomes clogged, or if the water pump breaks down, leading to overheating of the engine and thereby causing damage to the cylinder or a piston.

Further, if a propeller with a smaller pitch than the standard value is used, or one with the standard pitch but a small load, the engine speed increases to an undesirable level, thereby reducing the life of the engine to a remarkable extent.

Recently, a separate oiling type of outboard engine has been widely used. In such an outboard engine, when the level of oil drops to or below a prescribed level, or when an oil filter becomes clogged, the operator must be warned in some way of the shortage of oil or of the clogging of the filter.

An alarm device for outboard engines is required from the above-described viewpoints.

A known alarm device for outboard engines is of a type which includes a control system for controlling the ignition so as to maintain the engine speed below a fixed value when the engine speed becomes too high because of the use of a propeller with a smaller pitch than the standard value or owing to the generation of cavitation during running, and which at the same time generates an alarm to the operator by an alarming means such as a buzzer when this control system which prevents excessive engine speed is operated, when the circulation of cooling water stops due to an abnormality generated in the cooling system of the engine, when the oil level drops to an alarming level in a separate oiling engine, or when the oil does not flow due to clogging of an oil filter.

However, with such an alarm device, the audio volume of the alarms must be very high, in particular during high speed running. Otherwise, it might not be heard by the operator, because the engine sound and wind noise are relatively high. On the other hand, if the volume is adjusted so that the alarm can be heard at high speed running, it becomes too high during idling (trawling) or medium speed running.

In view of the above-described problem of known systems, an object of the present invention is to provide an audio alarm outputting device for an outboard engine which is capable of automatically changing the audio volume of the alarm in accordance with the speed of the outboard engine so as to enable an operator to easily detect and recognize alarms associated with abnormalities of the outboard engine, regardless of the speed thereof.

SUMMARY OF THE INVENTION

The above-described object is achieved by providing an audio alarm outputting device for an outboard engine which includes a plurality of sensors for detecting abnormalities, such as in the cooling water flow, and a speech outputting circuit for receiving output signals from the plurality of sensors and outputting abnormal conditions of the signals in a vocalized form. A variable voice level setting circuit cooperable with the speech outputting circuit automatically increases in steps the output level of the speech outputting circuit as the engine speed increases.

BRIEF DESCRIPTION OF THE DRAWINGS

An embodiment of the present invention will be described below with reference to FIGS. 1 to 5, in which.

DETAILED DESCRIPTION

Figure 1:
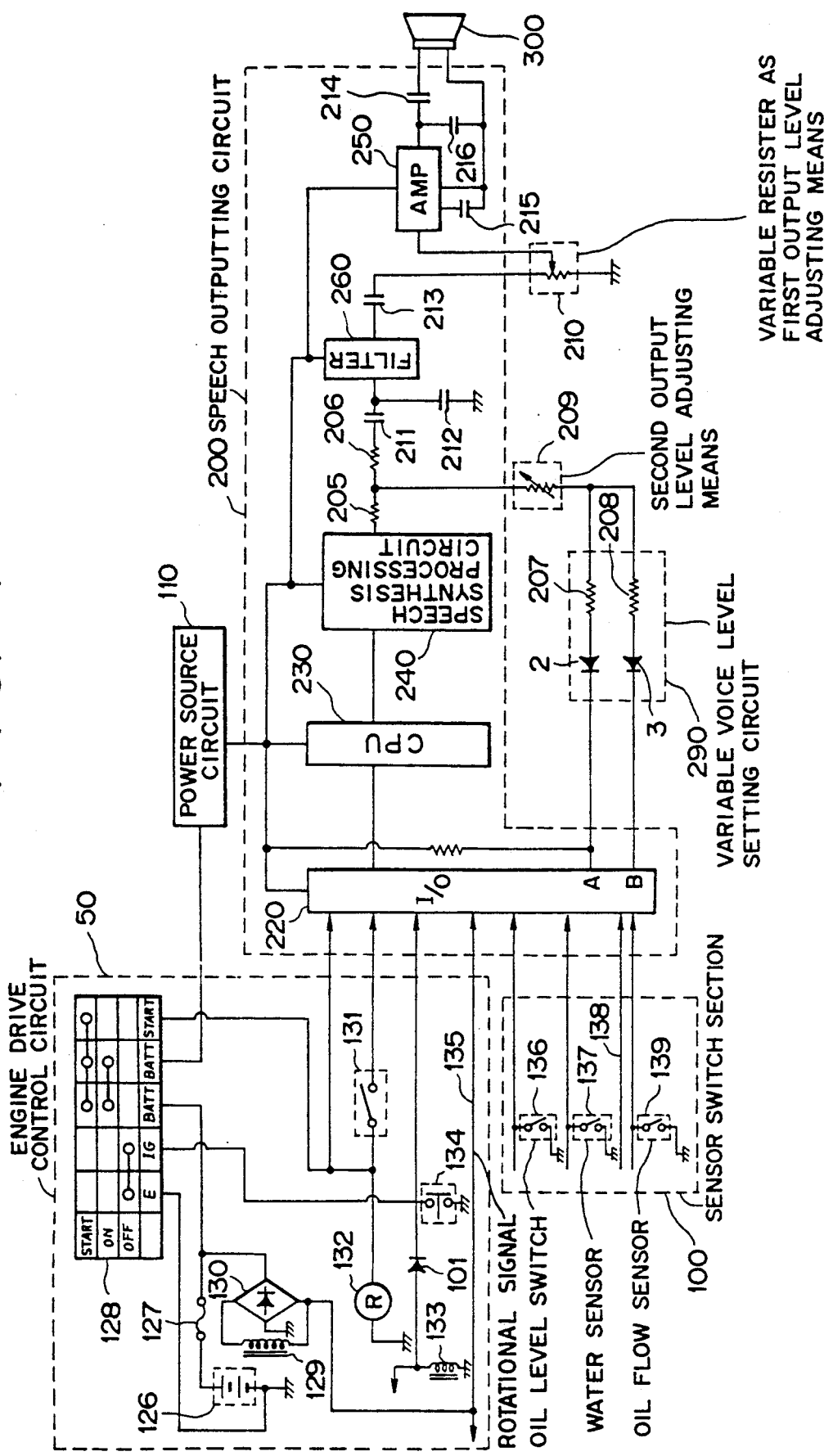
FIG. 1 is a schematic block diagram of one system embodying the present invention.

In the drawings, 135 is an engine rotational signal, 136 is an oil level switch, 137 is a water sensor, 139 is an oil flow sensor, 200 is a speech outputting circuit, 209 is a second output level adjusting means, 210 and 219 are each a variable resistor serving as a first output level adjusting means, and 290 is a variable voice level setting circuit.

Referring first to FIG. 1, an audio alarm outputting device of the preferred embodiment includes an engine drive control circuit 50, includes a sensor switch section 100 incorporating a plurality of sensors for detecting abnormalities (for example in the cooling water), includes a speech outputting circuit 200 for determining whether or not an abnormality exists and whether or not it should be output as an alarm on the basis of signals from the sensors, for determining the priority of input signals representing abnormalities in accordance with a predetermined order of importance, and for then outputting a synthesized speech signal, and includes a speaker 300 for converting the output of the speech outputting circuit 20 to an audible form. A variable speech level setting circuit 290 automatically increases the output level of the speech outputting circuit in steps to higher levels as engine speed increases, and a second output level adjusting means 209 finely adjusts the output level of the variable speech level setting circuit in each step, as appropriate, except possibly for at the highest level.

Abnormalities in the engine system and cooling water system of an outboard engine and their detection will be described below.

Since it is dangerous if an engine is started when the gear mechanism is in any state other than neutral (for example in the forward or backward state), a neutral switch 131 is provided which is closed and allows a starter motor to be actuated only when the gear mechanism is at the neutral state. Therefore, if an ignition switch 128 is turned to "START" while the gear mechanism is at a position other than neutral, current does not flow through a starter motor relay 132 because the neutral switch 131 is open, thereby preventing the circuit from actuating the starter motor. An operator often forgets this and gets perplexed.

In this embodiment, both ends of the neutral switch 131 are connected to an input/output interface (I/O) 220 of the speech outputting circuit 200, which is to be described later, and the start terminal of the ignition switch 128 is also connected to the I/O 220.

Therefore, the speech outputting circuit 200 checks for a difference in potential between the two ends of the neutral switch 131, judges whether a difference in potential exists or in other words whether the ignition switch 128 is at "START" and the gear mechanism is at a position other than neutral, and in such case outputs a predetermined instruction such as "Return the shift lever to the neutral position" from the speaker 300.

In order to stop a boat immediately if the operator falls in the water for some reason, an emergency switch (E/SW) 134 is often provided. The E/SW 134 has a cap which is attached to the end of a rope and is removably mounted on a body of the switch body. The E/SW 134 is off while the cap is in place and pressing against a shaft of the switch. It is turned on when the shaft moves in response to removal of the cap. The operator ties the end of the rope attached to the cap attached to his or her body. The cap is separated from the switch body if the operator falls in the water, turning the contact of the E/SW 134 on. The E/SW 134 is connected in parallel to a stop circuit of the ignition switch 128. Therefore, the stop circuit is actuated by the separation of the cap and stops the engine.

There are also cases where the cap of the E/SW 134 is in place but the stop circuit is short-circuited. In this embodiment, the positive side of a condenser charging magnet coil 133 is connected through a diode 101 to the stop circuit of the ignition switch 128 and the emergency switch 134, and the circuit node between the condenser charging magnet coil 133, the stop circuit of switch 128, and emergency switch 134 is also connected to the I/O 220 of the speech outputting circuit 200. A rectifier 130 is connected to both ends of a battery charging magnet coil 129, so that a battery 126 is charged by the coil 129 through a fuse 127. One of the connections between the rectifier 130 and the battery charging coil 129 is connected to the I/O 220 of the speech outputting circuit 200.

In consequence, when the starter motor is actuated by ignition switch 128, a rotor with a magnet is rotated and produces an output from the battery charging coil 129. A rotational signal 135 produced by the coil 129 is therefore input to the speech outputting circuit 200 so as to enable the speech outputting circuit 200 to judge that the engine is in operation. At this time, if the cap of the E/SW 134 is separated therefrom or if the stop circuit is grounded, no sparks are generated. At the same time, the level of the output to the I/O 220 becomes "low" (L), causing the speech outputting circuit 200 to judge that there is an abnormality and to vocalize "abnormality in the stop circuit". On the other hand, if the cap of the E/SW 134 is in place and the stop circuit is normal, the output to the I/O 220 is at a "high" (H) level. Therefore, the speech outputting circuit judges that the stop circuit is in a normal state, and generates no warning.

An oil level switch 136 is set such that it is turned on when the level of engine oil contained in an oil tank goes below a predetermined level, and thereby informs the operator of the necessity to replenish the oil.

One end of the oil level switch 136 is connected to the I/O 220 of the speech outputting circuit 200, and the level of the output to the I/O 220 drops in response to turning on of the oil level switch 136. This causes the speech outputting circuit 200 to judge that the oil level has reached a warning level and to vocalize a predetermined phrase identifying this condition. The oil level switch is turned off when the level becomes higher due to the addition of oil by the operator. This causes the level of the output to the I/O 220 to rise, stopping the audio output.

A water sensor 137 is mounted on a cylinder head of the engine or the like. It is capable of detecting whether or not cooling water is circulating within the engine in a normal state after the engine has been started. It also has the function of detecting an abnormality when flow of the cooling water ceases during engine operation for some reason. In this embodiment, the sensor 137 is turned on when an abnormality occurs.

One end of the sensor 137 is connected to the I/O 220 of the speech outputting circuit 200. Turning on of the water sensor 137 causes the level of the output to the I/O 220 to drop, which causes the speech outputting circuit 200 to judge that there is an abnormality in the cooling water and thereby to vocalize a predetermined phrase identifying this condition. The audio output stops when the abnormal state is removed and the water sensor 137 is thereby turned off.

In addition to the oil level switch 136 which detects the level of oil in the oil tank, an oil flow sensor 139 is provided to detect any abnormality that occurs in the flow of oil between the oil tank and the engine due to clogging of the oil filter, since reduced oil flow can cause seizing of the engine. Any abnormality in the flow of oil causes the oil flow sensor 139 to turn on. One end of the oil flow sensor 139 is connected to the I/O 220 of the speech outputting circuit 200, so that the level of the output to the I/O 220 of the speech outputting circuit 200 drops due to the turning on of the oil flow sensor 139. This enables the speech outputting circuit 200 to judge that an abnormality has occurred and to vocalize a predetermined phrase identifying this condition. The audio output stops when the abnormal state is removed and the oil flow sensor 139 is turned off.

The engine drive control circuit 50 includes the function of acting as a revolution limiter by cutting off sparks when the engine speed reaches or exceeds a predetermined value (an engine speed set for preventing excessive speed), because excessive speeds can damage the engine or shorten its life. It is also capable of cutting off sparks and thereby reducing the engine speed to a set speed (a engine speed set for an abnormal condition) when the engine speed becomes larger than the set speed while the circulation of the cooling water within the cylinder jacket is being hindered or while the oil level is at a dangerously low level.

The revolution limiter circuit is not shown in the drawings and is not itself the subject of the present invention. A suitable revolution limiter circuit is disclosed in copending U.S. Ser. No. 750 962 filed July 2, 1985, the disclosure of which is hereby incorporated herein by reference.

The revolution limiter (not shown) is connected to the I/O 220 of the speech outputting circuit 200 through an output signal line 138. If a signal is input to the I/O 220 across the output signal line 138, the speech outputting circuit 200 judges that the revolution limiter is in operation, and vocalizes a predetermined instruction from the speaker 300 urging the operator to reduce the engine speed.

Next, the structure and operation of the speech outputting circuit 200 will be described.

The speech outputting circuit 200 includes the I/O 220, a central processing unit (CPU) 230, a speech synthesis processing circuit 240, and an amplifier (AMP) 250. Reference numeral 110 denotes a power source circuit.

The I/O 220, CPU 230 and speech synthesis processing circuit 240 are all circuits of a type conventionally used for speech synthesis, and the computer program required for speech synthesis in the CPU 230 is of a conventional type and will be immediately evident to those of ordinary skill in the art from the explanation of the functional operation of these components which follows. Accordingly a detailed disclosure of the computer program and the circuits 220, 230 and 240 has been omitted.

The power source circuit 110 inputs power from a battery, adjusts it to an appropriate operating voltage for the CPU 230 and the like, and outputs a stable voltage having a fixed level to the I/O 220, the central processing unit (CPU) 230, and the speech synthesis processing circuit 240. The I/O 220 receives signals from the various sensors and switches, converts them to a form which can be accepted by the CPU 230, and outputs them to the CPU 230.

The CPU 230 determines whether or not each of the signals from the I/O 220 represents an abnormality, determines its priority in accordance with the predetermined order of priority, and then outputs the result to the I/O 220 and the speech synthesis processing circuit 240. The speech synthesis processing circuit 240 forms a required audio signal by fetching a basic word of the audio signal from a memory (not shown) on the basis of the signal from the CPU 230, and delivers it to a filter 260 and the AMP 250.

The speech synthesis processing circuit 240 is connected through resistors 205 and 206 and a capacitor 211 to the filter 260. The filter 260 is in turn is connected through a capacitor 213 to a variable resistor 210 which serves as a first output level adjusting means. The variable contact of the variable resistor 210 is connected to the AMP 250, the output of which is in turn connected through a capacitor 214 to the speaker 300. The other side of the speaker 300 is connected to the AMP 250. Capacitors 211, 212, 213, 214, 215 and 216 are provided for the purpose of absorbing noise and improving the signal to noise (S/N) ratio.

The sound volume is adjusted by the speech outputting circuit in the manner described below.

Figure 3:
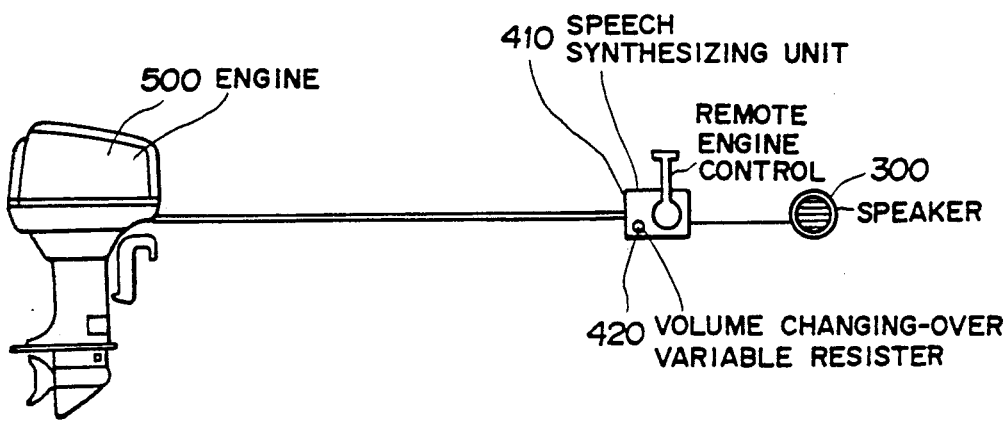
FIGS. 3 and 4 show different ways of coupling the system shown in FIG. 1 to an outboard engine.

If a speech synthesizing unit 410 containing the speech outputting circuit 200 is separated from an engine 500 and is disposed for example near or in a remote control box, as shown in FIG. 3, a volume changing variable resistor 420 may be provided on the speech synthesizing unit 410. The volume changing variable resistor 420 serves to adjust the volume when the engine speed is low, for example in a range indicated by the arrow $X_1$ in FIG. 5(1). During idling or trolling, the operator is capable of adjusting the volume of audible alarms by operating the volume changing variable resistor 420.

The volume changing variable resistor 420 may be incorporated into the circuit as either a second output level adjusting means 209 or a first output level adjusting means 210, as shown in FIG. 1. This selection depends on which of two relationships between the engine speed and audio volume is selected, which relationships will be described below in association with FIGS. 5(1) and 5(2), respectively.

Figure 5:
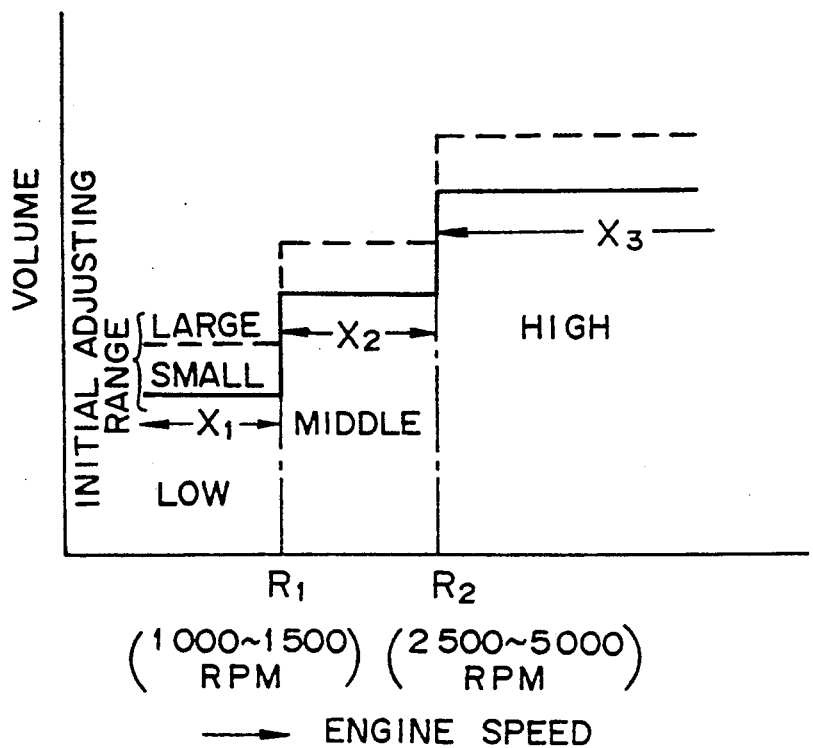
FIGS. 5 (1) and (2) are graphs showing changes in the audio output level which is varied in steps in the system shown in FIG. 1.
Figure 5:
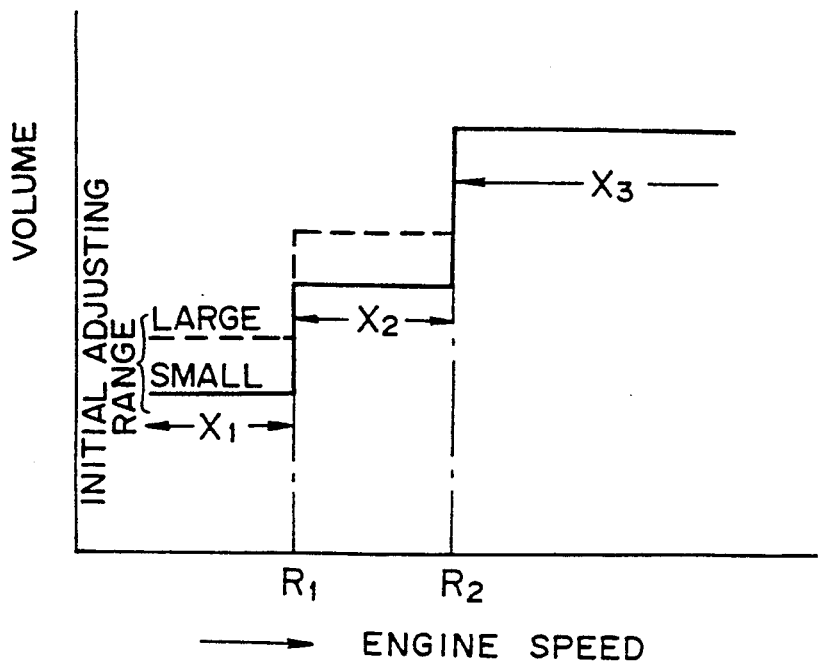

If the relationship between the engine speed and volume shown in FIG. 5(1) is to be selected, the variable resistor 210 is used as the volume changing variable resistor 420, and the resistor 209 is treated as a fixed resistor.

A set of a diode 2 and resistor 207 connected to each other in series and a set of a diode 3 and resistor 208 connected to each other in series together form the variable voice level setting circuit 290. One end of the variable voice level setting circuit 290 is connected to the second output level adjusting means 209, while the other end thereof is bifurcated to form points A and B which are connected to outputs of the I/O 220. Each of the points A and B can be set to a logic high or low level by the CPU 230, and the point A can be set to a high level while the point B is set to a low level.

The audio output signal from the speech synthesis processing circuit 240 passes through the resistors 205 and 206 and capacitor 211, and is input to the filter 260 which blocks its high frequencies. It then passes through the capacitor 213 and the variable resistor 210 and is input to the AMP 250, which amplifies it before it is output from the speaker 300 in audible form.

At this time, if the engine speed is R, or below, as shown in FIG. 5(1), the points A and B in FIG. 1 are both set to a low level by the control of the CPU 230. Therefore, part of the audio signal from the speech synthesis processing circuit 240, namely a portion of the current which passes through the resistor 205 and which is determined by the combined resistance of the resistors 207 and 208, flows into the points A and B of the I/O 220. This reduces the current which flows from the speech synthesis processing circuit 240 to the filter 260 and to the subsequent components to a great extent. The input to the AMP 250 is then varied by adjustment of the variable resistor 210 so as to vary the volume produced by the speaker 300 between the levels indicated by the broken and solid lines in the range $X_1$ of FIG. 5(1).

If the engine speed increases as a result of opening a throttle valve and exceeds the engine speed $R_1$ of FIG. 5(1) (so as to be between 1000 r.p.m. and 1500 r.p.m.), the level of the point A of the I/O 220 is changed by the CPU to be high, so that part of the audio output from the speech synthesis circuit, as determined by the resistor 208, flows into the point B of the I/O 220. Since the resistance of the resistor 208 is of course larger than the combined resistance of the resistors 207 and 208 obtained when the points A and B are both at a low level, the current which now flows to the point B is less than that which flowed to the points A and B when both were at a low level, and the current which flows to the filter 260 and subsequent components is therefore increased, thereby increasing the volume of sound from the speaker 300. The thus-obtained volume represents one between the broken and solid lines in a range $X_2$ in FIG. 5(1). If the volume initially adjusted when the engine speed was at or below $R_1$ is at a value indicated by the solid line in range $X_1$, the volume set after the engine speed has increased to the range $X_2$ is at a value indicated by the solid line in range $X_2$. If the initially adjusted volume is at a value indicated by the broken line in range $X_1$, it will be at a value indicated by the broken line in range $X_2$ after the engine speed has increased to range $X_2$.

If the engine speed further increases as a result of further opening the throttle valve and exceeds speed $R_2$ in FIG. 5(1) (so as to be between 2500 r.p.m. and 3000 r.p.m.), the levels of both of the points A and B of the I/O 220 are changed to be high. As a result, no audio output from the speech synthesis processing circuit 240 is input to the points A and B; the entire audio output from the speech synthesis processing circuit 240 is applied to the filter 260 and subsequent components, further increasing the volume of sound from the speaker 300 above the value which is obtained when the engine speed is within the range $X_2$ in FIG. 5(1). The thus-obtained volume is somewhere between the solid and broken lines in the range $X_3$.

In this system, the volume is increased in steps on the basis of the initially set value, and a respective volume, which is determined by the initially set value and which varies within the range between the solid and broken lines, is obtained in each speed range.

The volume can be varied at each step within the range indicated by the solid and broken lines, by varying the resistance of the variable resistor 210. Also, the rate at which the volume is increased as the engine speed increases from the range $X_1$ to range $X_2$ and from range $X_2$ to range $X_3$ may be adjusted by setting the resistance of each of the resistors 207 and 208 to a suitable value. The volume need not be increased by the same amount at each transition between speed ranges; the respective amounts of volume increase may be at different values which suit an actual operation.

Next, the pattern shown in FIG. 5(2) will be described. In this pattern, the volume is increased in the same manner as the pattern shown in FIG. 5(1), up to speed $R_2$. When the engine speed is at $R_2$ or above, however, the volume is fixed at one predetermined level which cannot be changed by the initial setting of the volume. This system is based on the concept that the volume should be set to a maximum value in the high speed range owing to a high level of engine sound and wind noise, even though adjustment of the volume may be appropriate in the low and medium speed ranges.

In that case, the variable resistor 209 is used as the sound volume changing variable resistor 420, and the resistor 210 is treated as being a fixed valve.

If the speed of the engine is at $R_1$ or below, namely in the range $X_1$ in FIG. 5(2), the points A and B of the I/O 220 are both at a low level as in the system shown in FIG. 5(1), so that part of the audio output current passing from the speech synthesis processing circuit 240 through the resistor 205 flows to the points A and B, in an amount determined by the combined resistance of the resistors 207, 208, and 209. At that time, the current from the speech synthesis processing circuit 240 is varied by changing the combined resistance, in particular by changing the value of the variable resistor 209, thereby changing the current which flows to the filter circuit and to the subsequent components, and thus changing the sound volume of the audio output from the speaker 300. The thus-obtained volume represents one between the solid and broken lines in the range $X_1$ in FIG. 5(2) with the solid line indicating the minimum volume and the broken line denoting the maximum volume.

If the engine speed increases as a result of opening the throttle valve and exceeds speed $R_1$ of FIG. 5(2), the level of the point A of the I/O 220 is changed to be high. As a result, no current flows to the point A, whereas part of the current from the speech synthesis processing circuit 240, in an amount determined by the resistance of the resistors 209 and 208, flows to the point B. Since the resistance obtained at this time is larger than that obtained while the engine speed is in the range $X_1$, the current which flows to the point B is less than that which flowed to the points A and B when points A and B were both low so that the current which flows to the filter 260 and to subsequent components is larger, thereby increasing the sound volume from the speaker 300. The thus-obtained volume represents one which can be varied between the solid and broken lines in the range $X_2$ in FIG. 5(2) by varying the initially set value.

If the engine speed further increases as a result of opening the throttle valve and exceeds speed $R_2$ in FIG. 5(2), the levels of the points A and B of the I/O 220 are both set to be high. As a result, no current of the audio output from the speech synthesis processing circuit 240 flows to the points A and B; the entire audio output of circuit 240 is input to the filter 260 and subsequent components, thereby maximizing the volume of the speaker 300. The thus-obtained volume is represented by the solid line in the range $X_3$, which is the maximum output and does not change in response to changes in the initially set value at resistor 209.

As in the first system, the amounts by which the volume is increased as the speed ascends from range $X_1$ to range $X_2$ and from range $X_2$ to range $X_3$ may be varied by setting the resistance of each of the resistors 207 and 208 to a suitable value.

Figure 2:
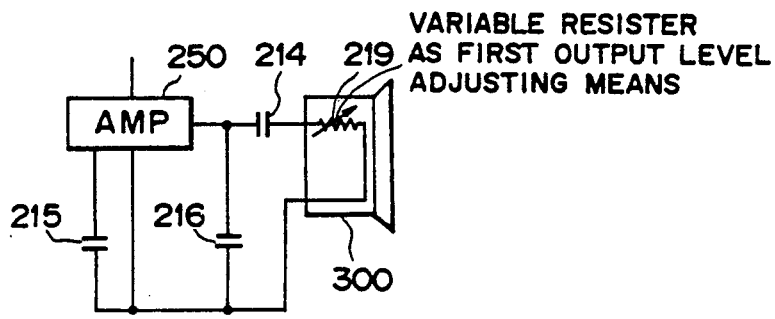
FIG. 2 is a schematic block diagram showing a variation of a first output level adjusting arrangement which is a component of the system of FIG. 1.
Figure 4:
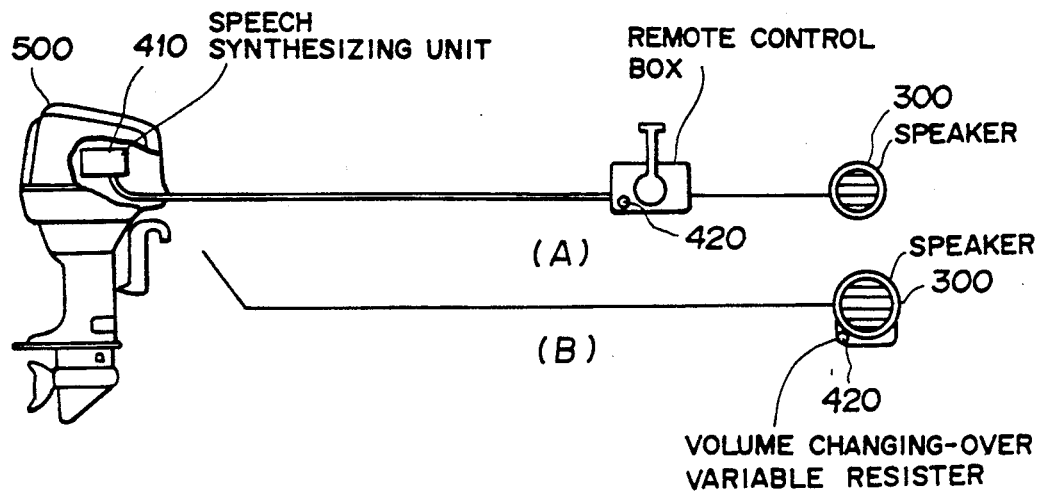

If the speech synthesizing unit 410 is disposed within the engine 500, as shown in FIG. 4, the sound volume changing variable resistor 420 is not provided on the unit 410, but may be provided either on the remote control box as shown at (A) in FIG. 4, or on the speaker 300 as shown at (B) in FIG. 4. In the latter case, a resistor 219 may be provided either within the speaker 300, as shown in FIG. 2, or between the capacitor 214 and speaker 300. In this case, the variable resistors 209 and 210 are treated as being fixed values.

This circuit operates in the same manner as the system shown in FIG. 5(1), with the exception that the variation of the volume is performed using the resistor 219 rather than the variable resistor 210. This enables the operator to easily adjust the initial sound volume.

As will be understood from the foregoing description, it is possible according to the present invention for the operator to change the sound volume at any engine speed, except within range $X_2$ of FIG. 5(2). Further, the sound volume automatically increases as the engine speed increases, enabling the operator to hear vocalized instructions which would otherwise be drowned out by the engine sound and wind noise. Reduction in the volume as a result of reduction in the engine speed can eliminate an embarrassing situation in which an uncomfortably loud instruction is heard while the engine sound is low.

In this embodiment, detection of six types of abnormalities has been described. However, other items for detection may be added, if desired.

In the above description, the oil level switch, the water sensor, and the oil flow sensor are normally off, and are each turned on when the associated abnormality occurs. The audio output is generated when the level of each of the output portions of the I/O 220 of the speech outputting circuit drops. However, these are not limited to the above-described method, because the sensors may be normally on and may be turned off when the abnormality occurs. The audio output may be generated when the level of each of the output portions of the I/O 220 of the speech outputting circuit rises.

With the above-described structure and function of the present invention, abnormalities (for example in the cooling water) can be immediately and externally output in a vocalized form by the effect of the speech outputting circuit, enabling the operator to take quick and necessary action with respect to the outboard engine.

The level of the audio output can be automatically changed in steps as the engine speed varies, by the effect of the speech outputting circuit and the variable voice level setting circuit. This enables the operator to easily detect abnormalities occurring in the outboard engine and to recognize them. Further, the invention includes the output level adjusting means which enables the level of the output to be finely adjusted in each step except for the highest level.

The embodiments of the invention in which an exclusive property or privilege is claimed are defined as follows:

1. An audio alarm apparatus for an engine, comprising: sensor means for detecting an abnormality in the operation of the engine, speech outputting circuit means responsive to detection of said abnormality by said sensor means for outputting an audible synthesized vocal statement at a volume which can be varied, and voice level setting means cooperable with said speech outputting circuit means and responsive to the speed of the engine for controlling the volume of said audible synthesized spoken statement in response solely to variations in the speed of the engine; wherein said voice level setting means sets the volume for a vocal statement to a respective discrete level in each of a plurality of respective engine speed ranges, wherein as the speed of the engine increases from one of said speed ranges to the next higher speed range said level setting means increases the volume for the vocal statement in a step-like manner from one of said discrete levels to another of said discrete levels which is higher, wherein said speech outputting circuit means includes a speaker and includes a speech signal synthesizing circuit which has a signal output coupled to said speaker and which has a control output, and wherein said level setting means is operatively coupled to said signal output and is responsive to variations of a voltage at said control output for varying characteristics of a signal at said signal output.

2. An apparatus of claim 1, wherein said level setting means recognizes three said engine speed ranges and for each said speed range sets the volume for a vocal statement to a respective one of three said discrete levels.

3. An apparatus of claim 1, including adjusting means for facilitating limited manual adjustment of the volume level for a vocal statement.

4. An apparatus of claim 3, wherein said adjusting means facilitates limited manual adjustment of the volume for a vocal statement in each of said speed ranges.

5. An apparatus of claim 4, wherein said adjusting means includes a variable resistor, and wherein said signal output of said speech signal synthesizing circuit is coupled through said variable resistor to said speaker.

6. An apparatus of claim 3, wherein said adjusting means facilitates said limited adjustment of the volume level for a vocal statement in each of said speed ranges except the highest speed range.

7. An apparatus of claim 1, wherein said level setting means includes a diode having a cathode coupled to said control output and includes a resistor having a first end coupled to an anode of said diode and a second end coupled to said signal output.

8. An apparatus of claim 7, wherein said synthesizing circuit has a further control output, and wherein said level setting means includes a further diode having a cathode coupled to said further control output and includes a further resistor having a first end coupled to an anode of said further diode and a second end coupled to said second end of said first-mentioned resistor.

9. An apparatus of claim 8, including a variable resistor having one end coupled to said second ends of said first-mentioned and further resistors and having a further end coupled to said signal output.

* * * * *